US012796260B2

(12) United States Patent
Li et al.

(10) Patent No.: US 12,796,260 B2
(45) Date of Patent: Nov. 10, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Hengyi Li, Wuhan (CN); Gui Chen, Wuhan (CN); Wenyuan Xiong, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 365 days.

(21) Appl. No.: 18/496,893

(22) Filed: Oct. 29, 2023

(65) Prior Publication Data

US 2024/0268173 A1 Aug. 8, 2024

(30) Foreign Application Priority Data

Feb. 7, 2023 (CN) ......................... 202310099937.8

(51) Int. Cl.
*H10K 59/131* (2023.01)
*H10K 59/122* (2023.01)
*H10K 59/65* (2023.01)

(52) U.S. Cl.
CPC ....... *H10K 59/1315* (2023.02); *H10K 59/122* (2023.02); *H10K 59/65* (2023.02)

(58) Field of Classification Search
CPC .. H10K 59/1315; H10K 59/122; H10K 59/65; H10K 59/124; H10K 59/131
See application file for complete search history.

(56) References Cited

U.S. PATENT DOCUMENTS

2017/0278919 A1* 9/2017 Matsumi ............ H10K 59/1315
2019/0361555 A1* 11/2019 Lee ....................... G06F 3/0412
(Continued)

FOREIGN PATENT DOCUMENTS

CN 109285466 A 1/2019
CN 110780501 A 2/2020
(Continued)

OTHER PUBLICATIONS

Chinese Office Action issued in corresponding Chinese Patent Application No. 202310099937.8 dated Aug. 25, 2026, pp. 1-10.

*Primary Examiner* — Yasser A Abdelaziez
(74) *Attorney, Agent, or Firm* — PV IP PC; Peter Stecher; Wei Te Chung

(57) ABSTRACT

A display panel and a display device are provided. The display panel display panel includes a substrate, and multiple metal layers and multiple insulating layers above the substrate. At least one of the insulating layers is disposed between two adjacent metal layers. The display panel includes: at least two adjacent first wiring, the first wiring being disposed in the display region, the first wiring including a first sub-wiring and a second sub-wiring extending in a same direction and separated by the functional region and the packaging region; and at least two adjacent windings connected between corresponding first sub-wiring and corresponding second sub-wiring respectively.

18 Claims, 5 Drawing Sheets

(56) References Cited

U.S. PATENT DOCUMENTS

| | | | | |
|---|---|---|---|---|
| 2020/0044008 | A1* | 2/2020 | Lee | G09G 3/3233 |
| 2020/0365674 | A1 | 11/2020 | Jeon | |
| 2022/0069052 | A1 | 3/2022 | Liu | |
| 2022/0077193 | A1* | 3/2022 | Shin | G06F 3/0446 |
| 2022/0130933 | A1* | 4/2022 | Yu | G09G 3/3233 |

FOREIGN PATENT DOCUMENTS

| | | | |
|---|---|---|---|
| CN | 110797373 | A | 2/2020 |
| CN | 212161815 | U | 12/2020 |
| CN | 114664899 | A | 6/2022 |
| CN | 115373173 | A | 11/2022 |

* cited by examiner

DISPLAY PANEL AND DISPLAY DEVICE

CROSS-REFERENCE TO RELATED APPLICATION

This application claims the priority to Chinese Application No. 202310099937.8, filed on Feb. 7, 2023, the contents of which are incorporated herein by reference in their entirety.

FIELD

The present disclosure relates to the field of display, and more particularly, to a display panel and a display device.

BACKGROUND

Display panels have been widely used in people's lives, such as screens for mobile phones, notebook computers, televisions, and the like. In order to increase a screen proportion of a mobile electronic terminal (particularly a mobile phone), existing art generally provides a hole-digging region in a display panel so that a functional element such as a camera is provided at a lower part of the display panel. After the hole-digging region is provided, it is generally necessary to provide a frame region between the hole-digging region and a display region to accommodate multiple windings and packaging structures of data lines.

However, a display abnormality such as a bright band that is significantly different from other display regions occurs below a hole-digging region of a current display panel.

SUMMARY

According to an embodiment of the present disclosure, a display panel and a display device are provided so as to solve a problem that a display abnormality such as a bright band that is significantly different from other display regions occurs below a hole-digging region of the current display panel.

According to an embodiment of the present disclosure, a display panel has a functional region, a packaging region surrounding the functional region, and a display region surrounding the packaging region. The display panel includes a substrate, and multiple metal layers and multiple insulating layers above the substrate. At least one of the insulating layers is disposed between two adjacent metal layers. The display panel includes: at least two adjacent first wiring, the first wiring being disposed in the display region, the first wiring including a first sub-wiring and a second sub-wiring extending in a same direction and separated by the functional region and the packaging region; and at least two adjacent windings connected between corresponding first sub-wiring and corresponding second sub-wiring respectively. The multiple layers of the insulating layers include a first-type insulating layer, and the first-type insulating layer is of an organic material. The two adjacent windings are disposed in different metal layers in the multiple metal layers, and at least one first-type insulating layer is disposed between the two adjacent windings in a thickness direction of the display panel.

Alternatively, in some embodiments of the present disclosure, the multiple insulating layers further include a second-type insulating layer, and the second-type insulating layer is of an inorganic material. At least one first-type insulating layer and at least one second-type insulating layer is disposed in two adjacent windings in the thickness direction of the display panel.

Alternatively, in some embodiments of the present disclosure, a layer structure of the display panel includes an anode above the substrate. The multiple metal layers are disposed between the substrate and the anode, two adjacent windings are in two metal layers farthest apart in the thickness direction of the display panel respectively.

Alternatively, in some embodiments of the present disclosure, the multiple metal layers include a first metal layer, a second metal layer, a third metal layer, and a fourth metal layer. The multilayer insulating layers include a first insulating layer, a second insulating layer, and a third insulating layer. A layer structure of the display panel includes: the first metal layer is on the substrate; the first insulating layer is on the first metal layer; the second metal layer is on the first insulating layer; the second insulation is on the second metal layer; the third metal layer is on the second insulating layer; the third insulating layer is on the third metal layer; and the fourth metal layer is on the third insulating layer. The third insulating layer is of an organic material. One of the two adjacent windings is in the first metal layer or the second metal layer, and the other of the two adjacent windings is in the fourth metal layer.

Alternatively, in some embodiments of the present disclosure, a laminated layer structure of the display panel include a substrate, a buffer layer on the substrate, a semiconductor layer on the buffer layer, a first gate insulating layer on the semiconductor layer, a first gate metal layer on the first gate insulating layer, a second gate insulating layer on the first gate metal layer, a second gate metal layer on the second gate insulating layer, a first interlayer insulating layer on the second gate metal layer, a second interlayer insulating layer on the first interlayer insulating layer, a source-drain metal layer on the second interlayer insulating layer, a first planarization layer on the source-drain metal layer, a first drain metal layer on the first planarization layer, a second planarization layer on the first drain metal layer, an anode layer on the second planarization layer, and a pixel definition layer on the anode layer. The first gate metal layer is the first metal layer. The second gate insulating layer is the first insulating layer. The second gate metal layer is the second metal layer. The first interlayer insulating layer and the second interlayer insulating layer are the second insulating layer. The source-drain metal layer is the third metal layer. The first planarization layer is the third insulating layer. The first drain metal layer is the fourth metal layer.

Alternatively, in some embodiments of the present disclosure, the multiple metal layers include a first metal layer, a second metal layer, a third metal layer, a fourth metal layer, and a fifth metal layer. The multiple insulating layers include a first insulating layer, a second insulating layer, a third insulating layer, and a fourth insulating layer. The first metal layer is on the substrate. The first insulating layer is on the first metal layer. The second metal layer is on the first insulating layer. The second insulating layer is on the second metal layer. The third metal layer is on the second insulating layer. The third insulating layer is on the third metal layer. The third insulating layer is of an organic material. The fourth metal layer is on the third insulating layer. The fourth insulating layer is on the fourth metal layer. The fourth insulating layer is of an organic material. The fifth metal layer is on the fourth insulating layer. One of the two adjacent windings is in one of the first metal layer and the second metal layer, and the other of the two adjacent windings is in one of the fourth metal layer and the fifth metal layer.

Alternatively, in some embodiments of the present disclosure, a laminated layer structure of the display panel include a substrate, a buffer layer on the substrate, a semiconductor layer on the buffer layer, a first gate insulating layer on the semiconductor layer, a first gate metal layer on the first gate insulating layer, a second gate insulating layer on the first gate metal layer, a second gate metal layer on the second gate insulating layer, a first interlayer insulating layer on the second gate metal layer, a second interlayer insulating layer on the first interlayer insulating layer, a source-drain metal layer on the second interlayer insulating layer, a first planarization layer on the source-drain metal layer, a first drain metal layer on the first planarization layer, a second planarization layer on the first drain metal layer, a second drain metal layer on the second planarization layer, a third planarization layer on the second drain metal layer, an anode layer on the third planarization layer, and a pixel definition layer on the anode layer. The first gate metal layer is the first metal layer. The second gate insulating layer is the first insulating layer. The second gate metal layer is the second metal layer. The first interlayer insulating layer and the second interlayer insulating layer are the second insulating layer. The source-drain metal layer is the third metal layer. The first planarization layer is the third insulating layer. The first drain metal layer is the fourth metal layer. The second planarization layer is the fourth insulating layer. The second drain metal layer is the fifth metal layer.

Alternatively, in some embodiments of the present disclosure, the two adjacent windings are a first winding and a second winding respectively. The display panel includes multiple windings. The first winding and the second winding are alternately arranged. Each of the windings includes a first connection line and a third connection line, and a second connection line between the first connection line and the third connection line. An extension direction of the second connection line is different from an extension direction of the first connection line and an extension direction of the third connection line. Two separated ends of the first connection line and the third connection line are connected to corresponding first sub-wiring and corresponding second sub-wiring respectively. The second connection line surrounds the functional region. At least two second connection lines of the two adjacent windings are adjacent.

Alternatively, in some embodiments of the present disclosure, multiple second connection lines are alternately arranged in different metal layers according to an arrangement order of multiple first connection lines.

Alternatively, in some embodiments of the present disclosure, projections of the two adjacent windings in the thickness direction of the display panel do not overlap.

Alternatively, in some embodiments of the present disclosure, the display panel further includes a conventional data line in the display region. The first wiring is a data line. The winding is connected between a first sub-wiring and a second sub-wiring of a same data line. A winding in the fourth metal layer or the fifth metal layer has a same resistance as a conventional data line of a same length in an extension direction of the conventional data line.

Alternatively, in some embodiments of the present disclosure, a width of the second connection line is less than a width of the first connection and a width of the third connection.

Alternatively, in some embodiments of the present disclosure, a width of the second connection line is less than a width of the first sub-wiring and a width of the second sub-wiring. A width of the first connection line and a width of the third connection line are both greater than the width of the first sub-wiring and the width of the second sub-wiring.

Accordingly, according to the present disclosure, a display device includes a housing and a display panel according to any one of the above. The display panel is housed within the housing.

According the present disclosure, there is provided a display panel and a display device. The display panel has a functional region, a packaging region surrounding the functional region, and a display region surrounding the packaging region. The display panel includes a substrate, and multiple metal layers and multiple insulating layers above the substrate. At least one of the insulating layers is disposed between two adjacent metal layers. The display panel includes: at least two adjacent first wiring, the first wiring being disposed in the display region, the first wiring including a first sub-wiring and a second sub-wiring extending in a same direction and separated by the functional region and the packaging region; and at least two adjacent windings connected between corresponding first sub-wiring and corresponding second sub-wiring respectively. The multiple insulating layers include a first-type insulating layer, and the first-type insulating layer is of an organic material. The two adjacent windings are disposed in different metal layers, and at least one first-type insulating layer is disposed between the two adjacent windings in a thickness direction of the display panel. In the present disclosure, two adjacent windings are disposed in different layers, at least one first-type insulating layer is disposed between two adjacent windings in the thickness direction of the display panel, and the first-type insulating layer is of an organic material. In the manufacturing process or the layer structure of the display panel, an insulating layer of an inorganic material is very thin, and an insulating layer of an organic material may be made very thick. A thickness of the insulating layer of the organic material may be more than ten times a thickness of the insulating layer of the inorganic material. Therefore, by providing at least one first-type insulating layer between two adjacent windings, a parasitic capacitance between adjacent windings can be reduced. When a specific picture is displayed on the display panel, signal crosstalk between multiple windings of the data lines is prevented, so that a display abnormality of a bright band that is significantly different from other display regions occurs below a hole-digging region.

DESCRIPTION OF DRAWINGS

In order that the technical solution in the embodiments of the present disclosure may be explained more clearly, explanation will now be made briefly to the accompanying drawings required for the description of the embodiments. It will be apparent that the accompanying drawings in the following description are merely some of the embodiments of the present disclosure, and other drawings may be made to those skilled in the art without involving any inventive effort.

DETAILED DESCRIPTION

In the following, the technical solutions in the embodiments of the present disclosure will be clearly and completely described in connection with the accompanying drawings in the embodiments of the present disclosure. It will be apparent that the described embodiments are merely part of the embodiments of the present disclosure, rather than all the embodiments. Based on the embodiments in the present disclosure, all other embodiments obtained by a person skilled in the art without involving any inventive effort are within the scope of the present disclosure. Furthermore, it is to be understood that the specific embodiments described herein are for purposes of illustration and explanation only and are not intended to limit the present disclosure. In the present disclosure, if not stated to the contrary, the use of positional terms such as “up” and “down” generally refer to the up and down positions of the device in actual use or working state, specifically the surface direction in the attached drawings; And “in” and “out” are with respect to the contour of the device.

Figure 1:
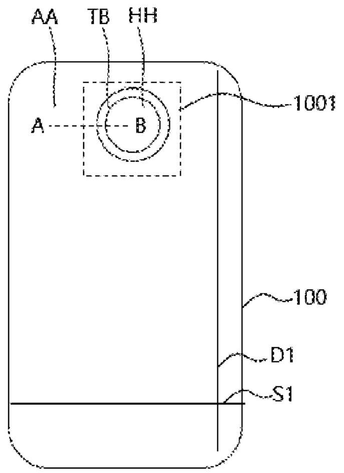
FIG. 1 is a top view of a display panel according to an embodiment of the present disclosure.
Figure 2:
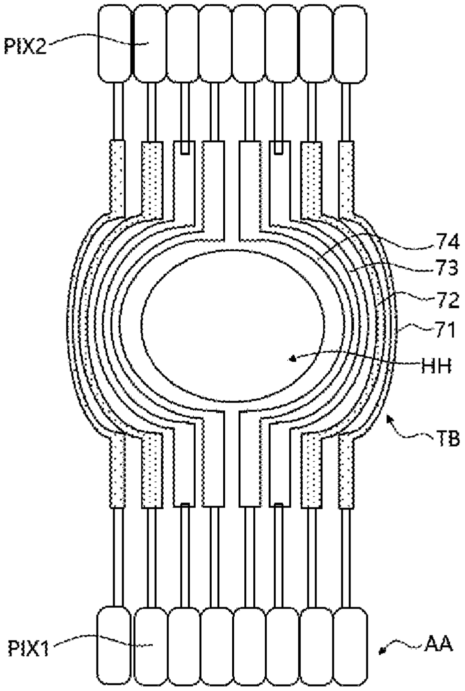
FIG. 2 (Prior Art)
FIG. 2 is a top view of an arrangement of windings in a hole-digging region of existing art.
Figure 3:
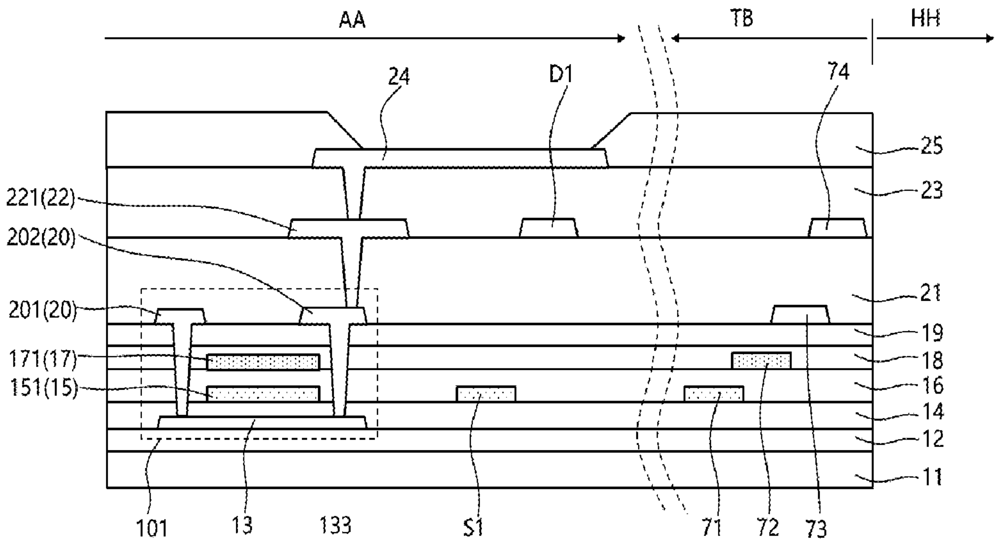
FIG. 3 (Prior Art)
FIG. 3 is a cross-sectional view of an arrangement of windings in a hole-digging region of existing art.

Refer to FIG. 1 to FIG. 3. FIG. 1 is a top view of a display panel according to an embodiment of the present disclosure, FIG. 2 is a top view of an arrangement of windings in a hole-digging region of existing art, and FIG. 3 is a cross-sectional view of an arrangement of windings in a hole-digging region of existing art. FIG. 2 is also a partially enlarged schematic diagram of a dashed box 1001 in FIG. 1. FIG. 3 is also a cross-sectional view at a dashed line A-B in FIG. 1.

A layer structure of a conventional display panel includes a substrate 11, a buffer layer 12 on the substrate 11, a semiconductor layer 13 on the buffer layer 12, a first gate insulating layer 14 on the semiconductor layer 13, a first gate metal layer 15 on the first gate insulating layer 14, a second gate insulating layer 16 on the first gate metal layer 15, a second gate metal layer 17 on the second gate insulating layer 16, a first interlayer insulating layer 18 on the second gate metal layer 17, a second interlayer insulating layer 19 on the first interlayer insulating layer 18, a source-drain metal layer 20 on the second interlayer insulating layer 19, a first planarization layer 21 on the source-drain metal layer 20, a first drain metal layer 22 on the first planarization layer 21, a second planarization layer 23 on the first drain metal layer 22, an anode layer 24 on the second planarization layer 23, and a pixel definition layer 25 on the anode layer 24. The display panel 100 further includes a thin film transistor 101. The thin film transistor 101 includes a semiconductor layer 13, a first gate 151 in the first gate metal layer 15, and a source 201 and a drain 202 in the source-drain metal layer 20. A second gate or a capacitor electrode 171 in the second gate metal layer 17 forms a capacitance with the first gate 151. A first connection electrode 221 in the first drain metal layer 22 is connected between the anode 24 and the drain 202.

In existing art, in order to minimize a width occupied by multiple windings in a hole-digging region and a width of a frame, metal layers made in a same layer or process as the first gate metal layer 15, the second gate metal layer 17, the source drain metal layer 20, and the first drain metal layer 22 are used as windings. FIG. 2 and FIG. 3 show that multiple windings in a hole-digging region of existing art include a first layer of windings 71, a second layer of windings 72, a third layer of windings 73, and a fourth layer of windings 74. In order to further reduce a width occupied by multiple windings in the hole-digging region and a width of a frame, at least two of the first layer of windings 71, the second layer of windings 72, the third layer of windings 73, and the fourth layer of windings 74 partially overlap in a thickness direction of the display panel (FIG. 2 does not show overlapping parts to clearly show the multiple windings). However, when the image is displayed after the display panel is illuminated, it is found that a display abnormality of a bright band that is significantly different from other display regions occurs below a hole-digging region. The reason for this abnormality is: when a specific screen is displayed on a display panel, because the parasitic capacitance between two adjacent windings is too large, signal crosstalk (signal interference) is generated between multiple windings of data lines, and finally, a display abnormality such as a bright band which is significantly different from other display regions occurs below a hole-digging region. Therefore, a solution to this abnormality is proposed, and multiple subsequent embodiments will be described in detail.

First Embodiment

Figure 4:
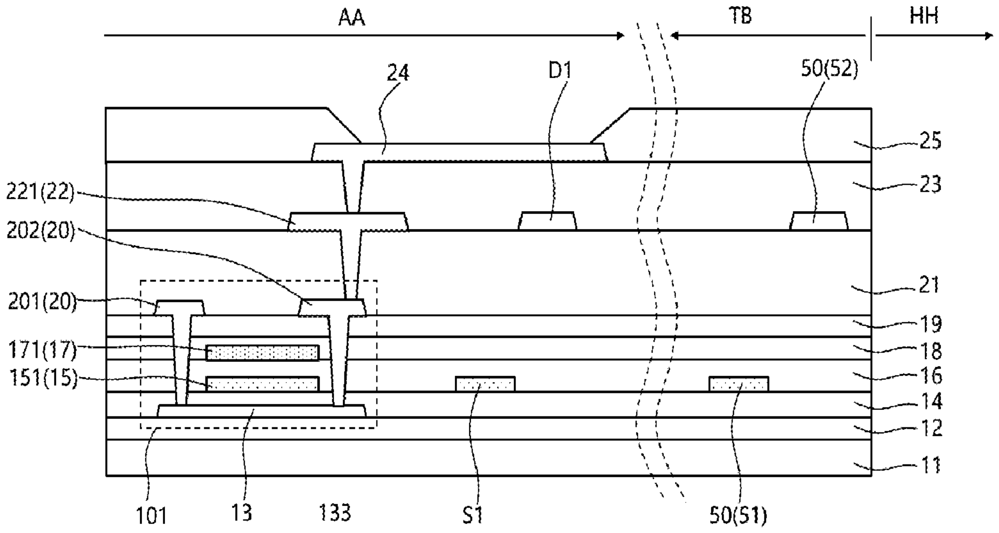
FIG. 4 is a cross-sectional view at a dashed line A-B in FIG. 1 according to an embodiment of the present disclosure.
Figure 5:
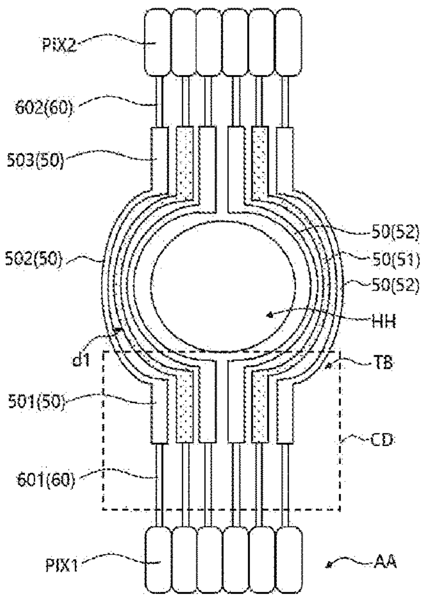
FIG. 5 is a first kind of partially enlarged schematic diagram of a dashed box 1001 in FIG. 1 according to an embodiment of the present disclosure.
Figure 6:
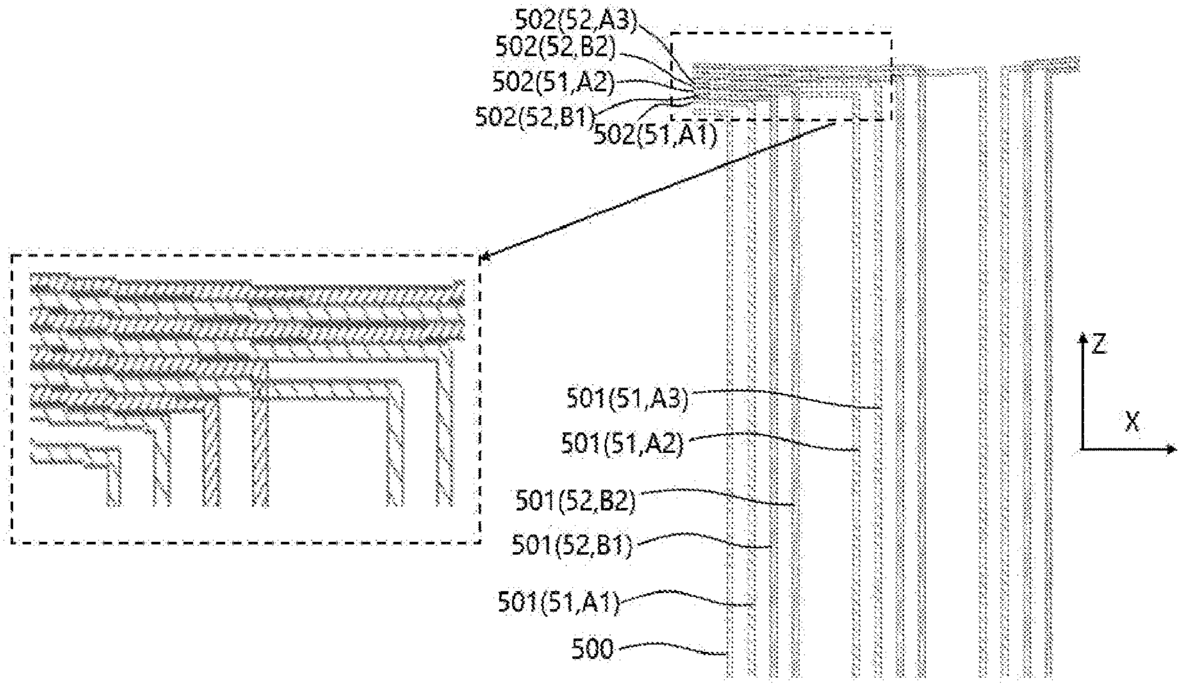
FIG. 6 is a second kind of partially enlarged schematic diagram of a dashed box 1001 in FIG. 1 according to an embodiment of the present disclosure.
Figure 7:
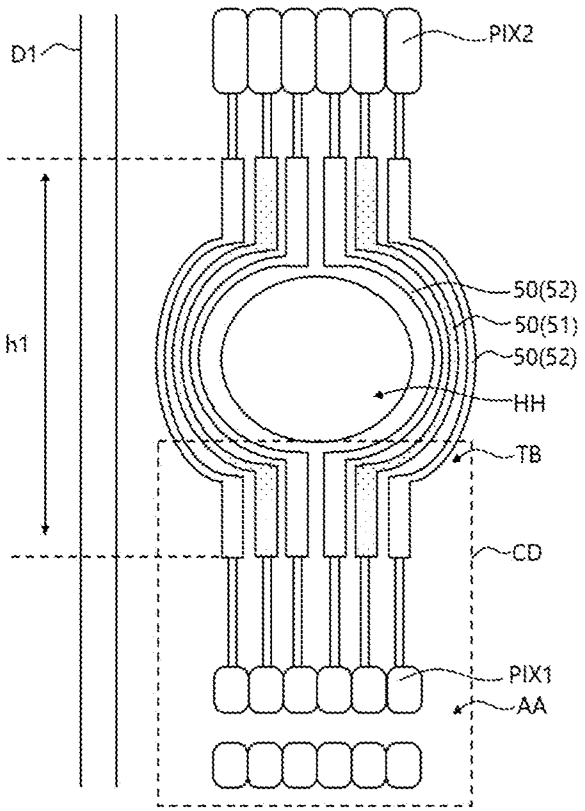
FIG. 7 is a schematic diagram of a comparison of a conventional data line with a winding according to an embodiment of the present disclosure.

Reference is made to FIG. 1, FIG. 4 to FIG. 7. FIG. 4 is a cross-sectional view at a dashed line A-B in FIG. 1 according to an embodiment of the present disclosure. FIG. 5 is a first kind of partially enlarged schematic diagram of a dashed box 1001 in FIG. 1 according to an embodiment of the present disclosure. FIG. 6 is a second kind of partially enlarged schematic diagram of a dashed box 1001 in FIG. 1 according to an embodiment of the present disclosure. FIG. 7 is a schematic diagram of a comparison of a conventional data line with a winding according to an embodiment of the present disclosure. FIG. 5 and FIG. 6 show same positions, except that for illustrating an arrangement of the windings in FIG. 6 more clearly, FIG. 6 only shows a different arrangement of the windings at a part corresponding to a dashed box CD in FIG. 5.

According to an embodiment of the present disclosure, a display panel 100 has a functional region HH, a packaging region TB surrounding the functional region HH, and a display region AA surrounding the packaging region TB. The display panel 100 includes at least two adjacent first wiring 60 and at least two adjacent windings 50. The first wiring 60 is in the display region AA. Each of the first wiring 60 includes a first sub-wiring 601 and a second sub-wiring 602 extending in a same direction and separated by the functional region HH and the packaging region TB. At least two adjacent windings 50 are connected between a corresponding first sub-wiring 601 and a corresponding second sub-wiring 602 respectively. The display panel 100 includes a substrate 11 and multiple metal layers over the substrate 11. The multiple metal layers include a first metal layer, a second metal layer, a third metal layer, and a fourth metal layer. The multiple insulating layers include a first insulating layer, a second insulating layer, and a third insulating layer. A layer structure of the display panel includes: a first metal layer is disposed on the substrate; the first insulating layer is disposed on the first metal layer; the second metal layer is disposed on the first insulating layer; the second insulating layer is disposed on the second metal layer, the third metal layer is disposed on the second insulating layer, the third insulating layer is disposed on the third metal layer, and the fourth metal layer disposed on the third insulating layer. The third insulating layer is of an organic material. One of the two adjacent windings is in the first metal layer and the other of the two adjacent windings is in the fourth metal layer.

Specifically, the display panel 100 includes a functional region HH, a packaging region TB surrounding the functional region HH, and a display region AA surrounding the packaging region TB. The functional region HH may be a hole-digging region or a virtual hole-digging region. The functional region HH corresponds to a functional structure or component such as a camera or a under-display fingerprint of a display terminal such as a mobile phone or a notebook computer. The packaging region TB may include one or more packaging sub-regions, for example, one packaging sub-region for providing a packaging reinforcing structure such as a dam, and one packaging sub-region for providing multiple windings 50. The functional region HH may be inside or at an edge portion of the display region AA.

Specifically, the display panel 100 includes multiple metal layers and multiple insulating layers. The multiple metal layers may be used to form structures such as multiple wiring and a driving circuit. The multiple insulating layers may be used to space the multiple metal layers or to protect the multiple metal layers.

Specifically, the first wiring 60 are in the display region AA. Each of the first wiring 60 includes a first sub-wiring 601 and a second sub-wiring 602 extending in a same direction and separated by the functional region HH and the packaging region TB. In FIG. 5, for example, the first wiring 60 are data lines. The first wiring 60 drive sub-pixels in a corresponding column. The first wiring 60 needs to drive sub-pixels on both sides of the functional region HH and the packaging region TB. But the first wiring 60 are blocked by the functional region HH and the packaging region TB, so the windings 50 needs to be provided.

Specifically, two adjacent windings 50 are respectively connected between a corresponding first sub-wire 601 and a corresponding second sub-wire 602. That is, when a first sub-wire 601 and a second sub-wire 602 are connected by a same winding 50, an electrical signal in the first sub-wire 601, the winding 50 and the second sub-wire 602 are same or connected. The electrical signal in the first sub-wire 601 may be transmitted to the second sub-wire 602 by the winding 50, or the electrical signal in the second sub-wire 602 may be transmitted to the first sub-wire 601 by the winding 50.

More specifically, as shown in FIG. 5, two adjacent windings 50 are a first winding 51 and a second winding 51 and 52 respectively. When the display panel 100 includes multiple windings 50, the first winding 51 and second winding 52 are alternately arranged.

It should be noted that each of the winding 50 includes a first connection line 501 and a third connection line 503, and a second connection line 502 between the first connection line 501 and the third connection line 503. An extension direction of the second connection line 502 is different from an extension direction of the first connection line 501 and an extension direction of the third connection line 503. Two separated ends of the first connection line 501 and the third connection line 503 are respectively connected to a corresponding first sub-wiring 601 and a corresponding second sub-wiring 602.

More preferably, the second connection line 502 surrounds the functional region HH. The two adjacent windings 50 means that at least two second connection lines 502 of the two windings 50 are adjacent. For example, a second connection line 502 of the first winding 51 is adjacent to a second connection line 502 of the second winding 52, a first connection line 501 of the first winding 51 is not adjacent to a first connection line 501 of the second winding 52, and a third connection line 503 of the first winding 51 is not adjacent to a third connection line 503 of the second winding 52. For example, the second connection line 502 of the first winding 51 is adjacent to the second connection line 502 of the second winding 52, the first connection line 501 of the first winding 51 is adjacent to the first connection line 501 of the second winding 52, and the third connection line 503 of the first winding 51 is adjacent to the third connection line 503 of the second winding 52.

Note that as long as the second connection line 502 of the first winding 51 is adjacent to the second connection line 502 of the second winding 52, the first winding 51 and the second winding 52 are two adjacent windings 50.

Specifically, in FIG. 4, the laminated layer structure of the display panel includes a substrate 11, a buffer layer 12 on the substrate 11, a semiconductor layer 13 on the buffer layer 12, a first gate insulating layer 14 on the semiconductor layer 13, a first gate metal layer 15 on the first gate insulating layer 14, a second gate insulating layer 16 on the first gate metal layer 15, a second gate metal layer 17 on the second gate insulating layer 16, a first interlayer insulating layer 18 on the second gate metal layer 17, a second interlayer insulating layer 19 on the first interlayer insulating layer 18, a source-drain metal layer 20 on the second interlayer insulating layer 19, a first planarization layer 21 on the source-drain metal layer 20, a first drain metal layer 22 on the first planarization layer 21, a second planarization layer 23 on the first drain metal layer 22, an anode layer 24 on the second planarization layer 23, and a pixel definition layer 25 on the anode layer 24. The display panel 100 further includes a thin film transistor 101. The thin film transistor 101 includes a semiconductor layer 13, a first gate 151 in the first gate metal layer 15, and a source 201 and a drain 202 in the source-drain metal layer 20. A second gate or a capacitor electrode 171 in the second gate metal layer 17 or a capacitor electrode metal layer forms a capacitor with the first gate 151. A first connection electrode 221 in the first drain metal layer 22 is connected between the anode 24 and the drain 202.

It should be noted that the above-mentioned naming of the metal layer is not intended to be the only limitation on the function and use of the metal layer. For example, the data lines of the display panel 100 may be in the first drain metal layer 22, and VDD signal lines may be in the first drain metal layer 22.

It should be noted that the material of the substrate 11 may be glass or a flexible substrate (polyimide or the like). The buffer layer 12, the first gate insulating layer 14, the second gate insulating layer 16, the first interlayer insulating layer 18, and the second interlayer insulating layer 19 are of inorganic materials such as silicon nitride or/and silicon oxide. The first planarization layer 21 and the second planarization layer 23 may be of organic materials, such as a photoresist, a photoresist, a resin, a polyimide, or the like. The materials of the first gate metal layer 15 and the second gate metal layer 17 may be same, such as molybdenum (Mo) or the like. The materials of the source-drain metal layer 20 and the first drain metal layer 22 may be same, such as a laminated layer of titanium/aluminum/titanium (Ti/Al/Ti).

It should be noted that an insulating layer of an organic material is defined as a first-type insulating layer, and an insulating layer of an inorganic material is defined as a second-type insulating layer. There is at least one first-type insulating layer between two adjacent windings 50.

Further, in some embodiments, in the thickness direction of the display panel, there are at least one first-type insulating layer and at least one second-type insulating layer between two adjacent disposed windings 50. By providing at least one first-type insulating layer between two adjacent windings, the parasitic capacitance between the adjacent windings can be reduced. When a display panel displays a specific screen, signal cross-talk between the multiple windings of the data lines can be prevented, thereby preventing the display abnormality of the bright band which is significantly different from other display regions from occurring below a hole-digging region of the current display panel.

Further, in some embodiments, the layer structure of the display panel includes an anode on the substrate, multiple metal layers between the substrate and the anode. Two adjacent windings are in two metal layers with a greatest distance therebetween of the multiple metal layers. The greater the distance, the weaker the signal crosstalk.

Specifically, in FIG. 4, the first gate metal layer 15 is the first metal layer. The second gate insulating layer 16 is the first insulating layer. The second gate metal layer 17 is the second metal layer. The first interlayer insulating layer 18 and the second interlayer insulating layer 19 are the second insulating layer. The source-drain metal layer 20 is the third metal layer. The first planarization layer 21 is the third insulating layer. The first drain metal layer 22 is a fourth metal layer.

In an embodiment, in the multiple metal layers between the anode 24 and the substrate 11, a distance between the first gate metal layer 15 and the first drain metal layer 22 is the greatest in the thickness direction of the display panel 100. That is, the distance between the first metal layer and the second metal layer in the thickness direction of the display panel 100 is the greatest. One of the two adjacent windings is in the first metal layer, and the other of the two adjacent windings is in the fourth metal layer. The distance between the two adjacent windings in the thickness direction of the display panel 100 is increased, thereby reducing the parasitic capacitance between the adjacent windings. When the display panel 100 displays a specific screen (reloaded screen), signal crosstalk between the multiple wiring 50 of the data lines are prevented, thereby preventing the display abnormality of the bright band that is significantly different from other display regions occurring below the functional region HH.

Further, in an embodiment, a third insulating layer is provided between the first metal layer and the second metal layer. The third insulating layer is of an organic material. That is, a first planarization layer 21 is provided between the first gate metal layer 15 and the first drain metal layer 22, and the third insulating layer or the first planarization layer 21 is of an organic material. In the manufacturing process or the film layer structure of the display panel 100, the insulating layer of the inorganic material is very thin, and the insulating layer of the organic material can be manufactured to be very thick. The thickness of the insulating layer of the organic material may be more than ten times the thickness of the insulating layer of the inorganic material. Therefore, by providing the insulating layer of the organic material between the two adjacent disposed windings 50, the distance between the two adjacent windings is increased, so that the parasitic capacitance between the adjacent windings can be reduced. When the display panel 100 displays a specific screen, signal cross-talk between multiple windings 50 of data lines or/and scan lines can be prevented. Therefore, the display abnormality of the bright band that is significantly different from other display regions can be prevented from occurring below the functional region HH.

Further, in the present embodiment, by setting a four-layer winding structure as a two-layer winding structure, the distance between two adjacent windings is prevented from being too close, and the parasitic capacitance is prevented from being too large.

In some embodiments, projections of the two adjacent windings 50 in the thickness direction of the display panel 100 do not overlap.

Specifically, when the projections of the first winding 51 and the second winding 52 overlap in the thickness direction of the display panel 100, for example, the orthographic projection of the first winding 51 on the substrate 11 and the orthographic projection of the second winding 52 on the substrate 11 have overlapped portions, there is a direct opposite portion between the first winding 51 and the second winding 52. The parasitic capacitance is significantly increased. When the projections of the two adjacent windings 50 in the thickness direction of the display panel 100 do not overlap, the parasitic capacitance can be significantly reduced.

Further, when a previous four-layer metal winding structure is modified to a two-layer metal winding structure, the width (frame width, layout width) occupied by the multiple windings 50 is increased by a large amount. In order to minimize the width occupied by the modified two-layer metal winding structure, multiple winding structures are provided in the packaging region, and the number of dummy pixels (pixel without display effect) in a region between the packaging region and the display region or a region adjacent to the packaging region and the display region is reduced or not set, so that extra space is used for providing the modified winding structure. At the same time, a design of reducing the width of the winding 50 is taken the to further reduce the width occupied after the multiple windings 50 are arranged. After a modification, the width occupied by the multiple windings 50 is almost unchanged, and the width of the packaging region is not increased.

Specifically, Table 1 is comparison data of the parasitic capacitance between two adjacent windings 50 before and after the modification. It can be seen from Table 1 that the parasitic capacitance between two adjacent wires 50 after the modification is significantly reduced, so that signal crosstalk between the multiple windings 50 of the data lines is prevented, thereby preventing the display abnormality of the bright band which is significantly different from other display regions from occurring below the functional region HH.

TABLE 1

| | | Four-layer wiring | Two-layer wiring |
|---|---|---|---|
| Parasitic capacitance | First gate metal layer 15 and second gate metal layer 17 | 0.113 | / |

TABLE 1-continued

| | | Four-layer wiring | Two-layer wiring |
|---|---|---|---|
| (fF) | First gate metal layer 15 and source-drain metal layer 20 | 1.169 | / |
| | Second gate metal layer 17 and source-drain metal layer 20 | 1.246 | / |
| | Source and drain metal layer 20 and first drain metal layer 22 | 0.227 | / |
| | First gate metal layer 15 and first drain metal layer 22 | 0.224 | 0.221 |

In some embodiments, the thickness of the first metal layer is greater than or equal to 0.25 micron and the thickness of the fourth metal layer is greater than or equal to 0.73 micron.

Specifically, although the width of the winding 50 is reduced to reduce the width of the packaging region, the decrease in the width of the winding 50 results in an increase in the impedance, so that a resistance difference between the data line having the winding 50 and a conventional data line is too large, the load (RC loading) of the data line having the winding 50 is too large, and the display uniformity of the display panel 100 is reduced. Therefore, it is proposed to increase the thickness of the winding 50.

Specifically, the thickness of the first metal layer is greater than or equal to 0.25 micron, and the thickness of the fourth metal layer is greater than or equal to 0.73 micron. That is, the thickness of the first gate metal layer 15 is greater than or equal to 0.25 micron, and the thickness of the first drain metal layer 22 is greater than or equal to 0.73 micron, so as to reduce the load of the winding 50.

In some embodiments, multiple second connection lines 502 are alternately arranged in different metal layers in an order in which the multiple first connection lines 501 are arranged.

Specifically, in a structure of multiple windings, the second connection line 502 of the first winding 51 and the second connection line 502 of the second winding 52 are alternately arranged, but the first connection line 501 of the first winding 51 and the first connection line 501 of the second winding 52 are not necessarily alternately arranged, and the third connection line 503 of the first winding 51 and the third connection line 503 of the second winding 52 are not necessarily alternately arranged. The first connection line 501 of the first winding 51 and the first connection line 501 of the second winding 52, or the third connection line 503 of the first winding 51 and the third connection line 503 of the second winding 52 may need to be arranged according to the sub-pixel arrangement of the display panel 100, the driving mode of the display panel, and the like.

Specifically, FIG. 5 and FIG. 6 illustrate two different arrangements of the winding 50.

Specifically, FIG. 5 shows that, in a structure of multiple windings, the second connection line 502 of the first winding 51 and the second connection line 502 of the second winding 52 are alternately arranged, the first connection line 501 of the first winding 51 and the first connection line 501 of the second winding 52 are alternately arranged, and the third connection line 503 of the first winding 51 and the third connection line 503 of the second winding 52 are alternately arranged.

Specifically, FIG. 6 shows that, in a structure of multiple windings, the second connection line 502 of the first winding 51 and the second connection line 502 of the second winding 52 are alternately arranged, but the first connection line 501 of the first winding 51 and the first connection line 501 of the second winding 52 are not alternately arranged, and the third connection line 503 of the first winding 51 and the third connection line 503 of the second winding 52 are not alternately arranged.

Specifically, FIG. 5 and FIG. 6 both show that in a structure of multiple windings, the second connection lines 502 are alternately arranged in different metal layers in an order in which the multiple first connection lines 501 are arranged.

Specifically, a first direction X is a direction perpendicular to an extension direction of the first connection line 501, and a third direction Z is a direction perpendicular to an extension direction of the second connection line 502. In FIG. 6, an arrangement of multiple first connection lines 501 in the first direction X is as follows: a first winding 51 (defined as a first-type first line A1) in the first metal layer, a second winding 52 (defined as a second-type first line B1) in the fourth metal layer, a second winding 52 (defined as a second-type second line B2) in the fourth metal layer, a first winding 51 (defined as a first-type second line A2) in the first metal layer, and a first winding 51 (defined as a first-type third line A3) in the first metal layer. An arrangement of multiple second connection lines 502 in the third direction Z in FIG. 6 is as follows: a first winding 51 (a first-type first line A1) in the first metal layer, a second winding 52 (a second-type first line B1) in the fourth metal layer, a first winding 51 (a first-type second line A2) in the first metal layer, a second winding 52 (a second-type second line B2) in the fourth metal layer, and a first winding 51 (a first-type third line A3) in the first metal layer.

Specifically, by comparing FIG. 5 and FIG. 6, it can be seen that the arrangement of the first connection line 501 of the first winding 51 and the first connection line 501 of the second winding 52, and the arrangement of the third connection line 503 of the first winding 51 and the third connection line 503 of the second winding 52 may be according to the arrangement manner, the driving manner of the multiple sub-pixels of the display panel, and the like, because the distance between adjacent first connection lines 501 or the distance between adjacent third connection lines 503 is large enough so that there is no signal crosstalk problem. When the multiple second connection lines 502 are arranged, in order to reduce the width occupied by the multiple second connection lines 502 and reduce the frame width of the packaging region TB, the distance between adjacent second connection lines 502 is set sufficiently small, so that there is a signal crosstalk problem. Therefore, two adjacent second connection lines 502 need to be in the first metal layer and the fourth metal layer respectively, so as to prevent signal crosstalk.

In particular, as can be seen from FIG. 6, alternately arranging the second connection lines 502 in different metal layers in an order in which the multiple first connection lines 501 are arranged may be understood as follows: at positions of multiple second connection lines 502, a second connection line 502 of the first winding 51 in the first metal layer is always adjacent to a second connection line 502 of the second winding 50 in the fourth metal layer, which is closest at a position of the first connection line 501 or the third connection line 503 of the winding 50; or, at positions of multiple second connection lines 502, a second connection line 502 of the first winding 51 in the fourth metal layer is always adjacent to a second connection line 502 of the second winding 50 in the first metal layer, which is closest at a position of the first connection line 501 or the third connection line 503 of the winding 50.

In some embodiments, the display panel further includes a conventional data line D1 in the display region AA. The first wiring 60 is a data line. The winding 50 is connected between a first sub-wiring 601 and a second sub-wiring 602 of a same data line. The winding 50 in the fourth metal layer has a same resistance as a conventional data line D1 of a same length in an extension direction of the conventional data line D1.

Specifically, as shown in FIG. 7, a same length as that of the winding 50 in the fourth metal layer in the extension direction of the conventional data line D1 is h1. The first drain metal layer 22 is the fourth metal layer. The conventional data line D1 is in the source-drain metal layer 20 or the first drain metal layer 22. A resistivity of the fourth metal layer is same as or similar to the resistivity of the conventional data line D1. Although a setting of the width of the winding 50 needs to consider a problem of reducing the width occupied by the multiple the windings 50, the winding 50 in the fourth metal layer can have the same resistance as that of the conventional data line D1 of the same length in the extension direction of the conventional data line D1. That is, the resistance of the conventional data line D1 in the length h1 is same as or similar to the resistance of the winding 50, so that the resistance of the wiring at various positions of the display panel 100 can be made more uniform, and the display screen of the display panel 100 is more uniform.

In some embodiments, each of the windings 50 include a first connection line 501, a third connection line 503, and a second connection line 502 between the first connection line 501 and the third connection line 503. The extension direction of the second connection line 502 is different from the extension direction of the first connection line 501 and the extension direction of the third connection line 503, and two separated ends of the first connection line 501 and the third connection line 503 are respectively connected to a corresponding first sub-wiring 601 and a corresponding second sub-wiring 602.

Specifically, as shown in FIG. 5, each of the windings 50 is divided into a first connection line 501, a second connection line 502, and a third connection line 503 according to the various positions or extension directions of each of the windings 50. The first sub-wiring 601, the first connection line 501, the second connection line 502, the third connection line 503, and the second sub-wiring 602 are sequentially connected end to end.

Specifically, FIG. 5 shows that the extension directions of the first connection line 501 and the third connection line 503 are same as the extension directions of the first sub-wiring 601 and the second sub-wiring 602. The second connection line 502 at least partially surrounds the functional region HH. The extension direction of the second connection line 502 may be set according to a shape of the functional region HH and other setting requirements of the display panel 100.

In some embodiments, the width of the second connection 502 is less than the width of the first connection 501 and the width of the third connection 503.

Specifically, by reducing the width of the second connection line 502, a width of a region occupied by the multiple second connection lines 502 can be reduced, When the multiple second connection lines 502 are disposed in the packaging region TB, a frame width of the packaging region TB can be reduced.

Specifically, by increasing the width of the first connection line 501 and the width of the third connection line 503, the resistance of the winding 50 can be reduced, and a resistance difference between a data line having or including the winding 50 and a conventional data line can be reduced.

In some embodiments, the width of the second connection 502 is less than the width of the first sub-wiring 601 and the width of the second sub-wiring 602, and the width of the first connection 501 and the width of the third connection 503 are both greater than the width of the first sub-wiring 601 and the width of the second sub-wiring 602.

Specifically, the width of the second connection line 502 is less than the width of the first sub-wiring 601 and the width of the second sub-wiring 602. By reducing the width of the second connection line 502, the frame width of the packaging region TB can be reduced, and a layout space occupied by the multiple second connection lines 502 can be reduced.

Specifically, the width of the first connection line 501 and the width of the third connection line 503 are both greater than the width of the first sub-wiring 601 and the width of the second sub-wiring 602, so that the resistance of the winding 50 can be reduced, and the resistance difference between the data line having or including the winding 50 and the conventional data line can be reduced.

It should be noted that the width of the second connection line 502 is less than the width of the first connection line 501 and the third connection line 503, the width of the second connection line 502 is less than the width of the first sub-wiring 601 and the width of the second sub-wiring 602, and both the width of the first connection line 501 and the width of the third connection line 503 are greater than the width of the first sub-wiring 601 and the width of the second sub-wiring 602. In this way, not only the frame width of the packaging region TB can be reduced, the layout space occupied by the multiple second connection lines 502 can be reduced, but also the resistance difference between the winding 50 and the conventional data line D1 of the same length in the extension direction of the conventional data line D1 can be reduced, thereby improving the display uniformity of the display panel 100. Further, when the resistivity of the material of the winding 50 is similar to or same as the resistivity of the material of the conventional data line D1, the winding 50 in the fourth metal layer can be made to have the same resistance as that of the conventional data line D1 of the same length in the extension direction of the conventional data line D1.

Second Embodiment

Figure 8:
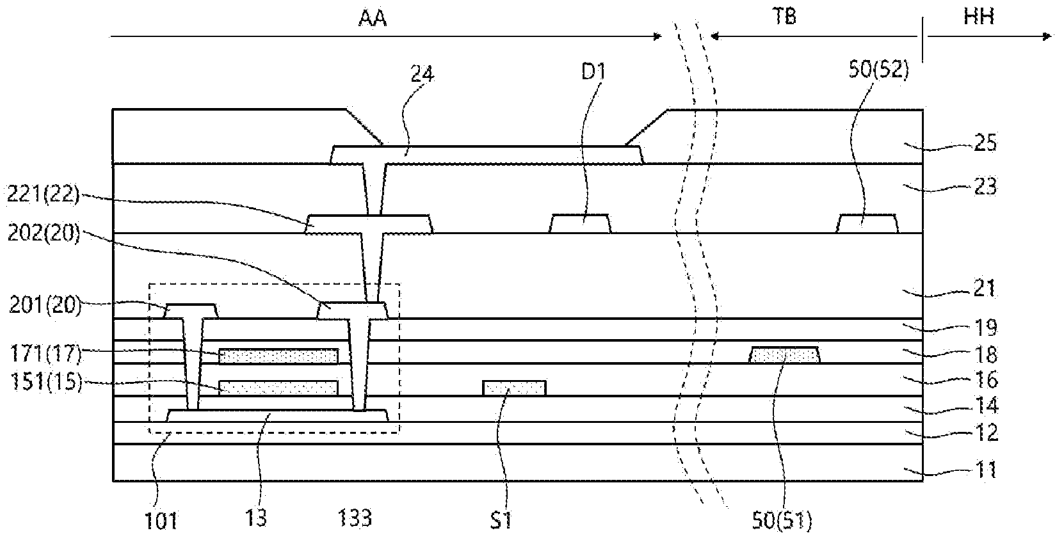
FIG. 8 is a cross-sectional view of a display panel according to an embodiment of the present disclosure.

Referring to FIG. 8, FIG. 8 is a cross-sectional view of a display panel according to another embodiment of the present disclosure. FIG. 8 and FIG. 4 are similar, except that the first winding 51 is provided on the second gate metal layer 17.

The second embodiment is the same as or similar to the display panel 100 according to any one of the first embodiment. Only differences are described herein, and similarities are not described herein.

One of the first winding 51 and the second winding 52 may also be provided in the second gate metal layer 17.

In some embodiments, one of the first winding 51 and the second winding 52 is disposed in the second metal layer and the other of the first winding 51 and the second winding 52 is disposed in the fourth metal layer.

Specifically, the second gate metal layer 17 is a second metal layer, and the first drain metal layer 22 is a fourth metal layer.

Specifically, In the manufacturing process or the layer structure of the display panel 100, an insulating layer of an inorganic material is very thin, and an insulating layer of an organic material may be made very thick. A thickness of the insulating layer of the organic material may be more than ten times a thickness of the insulating layer of the inorganic material. Therefore, the distance between the second gate metal layer 17 and the first gate metal layer 15 in the thickness direction of the display panel 100 is very small, and the distance between the second gate metal layer 17 and the first drain metal layer 22 in the thickness direction of the display panel 100 is very large, so that the wire winding 50 can also use the second gate metal layer 17, and has the same beneficial effect as the display panel in the first embodiment.

Third Embodiment

Figure 9:
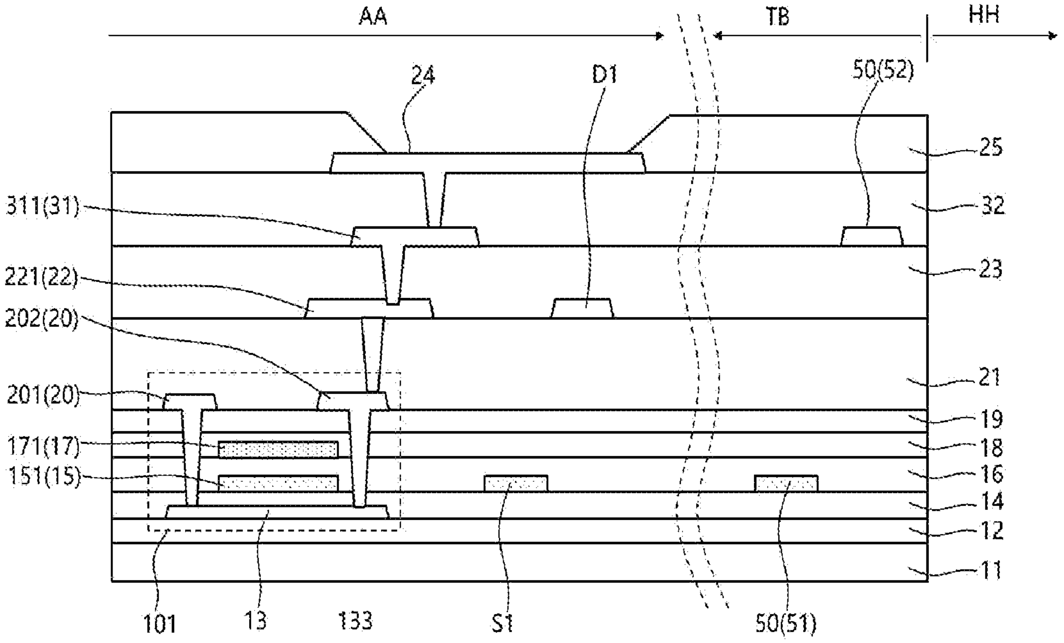
FIG. 9 is a schematic cross-sectional view of a display panel according to an embodiment of the present disclosure.

Refer to FIG. 9. FIG. 9 is schematic cross-sectional view of a display panel according to a third embodiment of the present disclosure. FIG. 9 is similar to FIG. 4 or FIG. 8, except that the display panel 100 further includes a second drain metal layer 31.

The third embodiment is the same as or similar to the display panel 100 according to any one of the first embodiment and the second embodiment, and only differences are described herein, and details are not described herein.

Specifically, FIG. 9 shows a laminated layer structure of a display panel 100. The display panel in FIG. 9 includes a substrate 11, a buffer layer 12 on the substrate 11, a semiconductor layer 13 on the buffer layer 12, a first gate insulating layer 14 on the semiconductor layer 13, a first gate metal layer 15 on the first gate insulating layer 14, a second gate insulating layer 16 on the first gate metal layer 15, a second gate metal layer 17 on the second gate insulating layer 16, a first interlayer insulating layer 18 on the second gate metal layer 17, a second interlayer insulating layer 19 on the first interlayer insulating layer 18, a source-drain metal layer 20 on the second interlayer insulating layer 19, a first planarization layer 21 on the source-drain metal layer 20, a first drain metal layer 22 on the first planarization layer 21, a second planarization layer 23 on the first drain metal layer 22, a second drain metal layer 31 on the second planarization layer 23, a third planarization layer 32 on the second drain metal layer 31, an anode layer 24 on the third planarization layer 32, and a pixel definition layer 25 on the anode layer 24. The display panel 100 further includes a thin film transistor 101. The thin film transistor 101 includes a semiconductor layer 13, a first gate 151 in the first gate metal layer 15, and a source 201 and a drain 202 in the source-drain metal layer 20. A second gate or a capacitor electrode 171 in the second gate metal layer 17 forms a capacitance with the first gate 151. A first connection electrode 221 in the first drain metal layer 22 is connected between the second connection electrode 311 and the drain electrode 202. A second connection electrode 311 in the second drain metal layer 31 is connected between the anode 24 and the first connection electrode 221.

Specifically, a material of the third planarization layer 32 is an organic material. A material of the third planarization layer 32 is same as a material of the first planarization layer 21 or/and the second planarization layer 23. The material of the second drain metal layer 31 may be same as the material of the source-drain metal layer 20 or/and the first drain metal layer 22.

In some embodiments, the display panel 100 further includes a substrate 11. The multiple metal layers include a first metal layer, a second metal layer, a third metal layer, a fourth metal layer, and a fifth metal layer. The multiple insulating layers includes a first insulating layer, a second insulating layer, a third insulating layer, and a fourth insulating layer. A layer structure of the display panel includes: the first metal layer is on the substrate 11, the first insulating layer is on the first metal layer, the second metal layer is on the first insulating layer, the second insulating layer is on the second metal layer, the third metal layer is on the second insulating layer, the third insulating layer is on the third metal layer, the fourth metal layer is on the third insulating layer, the fourth insulating layer is on the fourth metal layer, and the fifth metal layer is on the fourth insulating layer. The third insulating layer is of an organic material. The fourth insulating layer is of an organic material. One of two adjacent windings 50 is in one of the first metal layer and the second metal layer, and the other of the two adjacent windings is in one of the fourth metal layer and the fifth metal layer.

Specifically, in FIG. 9, the first gate metal layer 15 is the first metal layer. The second gate insulating layer 16 is the first insulating layer. The second gate metal layer 17 is a second metal layer. The first interlayer insulating layer 18 and the second interlayer insulating layer 19 are the second insulating layer. The source-drain metal layer 20 is the third metal layer. The first planarization layer 21 is the third insulating layer. The first drain metal layer 22 is the fourth metal layer. The second planarization layer 23 is the fourth insulating layer. The second drain metal layer 31 is a fifth metal layer.

Specifically, one of the two adjacent windings 50 is in one of the first metal layer and the second metal layer, and the other of the two adjacent windings is in the fourth metal layer, which has the same or similar beneficial effect as the display panel 100 of any one of the first embodiment and the second embodiment, and details are not described herein.

Specifically, one of the two adjacent windings 50 is in one of the first metal layer and the second metal layer, and the other of the two adjacent windings is in the fifth metal layer. The two adjacent windings 50 are spaced apart in the thickness direction of the display panel 100 by two insulating layers of organic material, so that the parasitic capacitance between the adjacent windings 50 can be reduced by a greater or maximum amount, thereby avoiding signal crosstalk.

It should be noted that, in an embodiment of the present disclosure, the display panel 100 includes a substrate 11 and an anode 24 disposed over the substrate, and multiple metal layers and a multiple insulating layers disposed between the substrate 11 and the anode. When the two adjacent windings 50 are farthest away in the thickness direction of the display panel 100, and most organic insulating layers are provided between the two adjacent windings 50 in the thickness direction of the display panel 100, the parasitic capacitance between the adjacent windings 50 can be reduced most greatly, and the problem that abnormal display of a bright band and the like which are significantly different from other display regions occurs below a hole-digging region, can be optimally solved.

Fourth Embodiment

Figure 10:
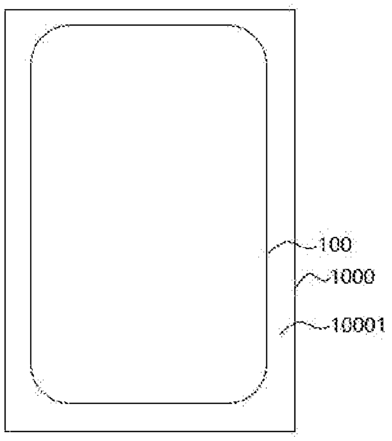
FIG. 10 is a schematic diagram of a display device according to an embodiment of the present disclosure.

Referring to FIG. 10, FIG. 10 is a schematic diagram of a display device 1000 according to a fourth embodiment of the present disclosure.

According to the fourth embodiment of the present disclosure, a display device 1000 includes a housing 10001 and a display panel 100 according to any one of the above embodiments. The display panel 100 is housed in the housing 10001.

Specifically, the display device includes a housing 10001 and the display panel 100 of the foregoing embodiments. The housing 10001 is formed with an accommodating cavity. The display panel 100 is assembled within the housing 10001. The display device 1000 may be a wearable device, such as a smart wristband, a smart watch, or a Virtual Reality (VR) device, or may be a mobile phone, an electronic book, an electronic newspaper, a television set, or a personal portable computer, or may be a flexible OLED display or lighting device that is flexible and foldable. A specific form of the electronic device is not specifically limited in the embodiments of the present disclosure.

The foregoing describes in detail a display panel and a display device according to an embodiment of the present disclosure. The principles and embodiments of the present disclosure are described herein using specific examples. The description of the above embodiments is merely used to help understand the method of the present disclosure and the core idea thereof. At the same time, variations will occur to those skilled in the art in both the detailed description and the application scope in accordance with the teachings of the present disclosure. In summary, the present description should not be construed as limiting the present disclosure.

What is claimed is:

1. A display panel, having a functional region, a packaging region surrounding the functional region, and a display region surrounding the packaging region, the display panel comprising:
- a substrate;
- a plurality of metal layers and a plurality of insulating layers above the substrate, wherein at least one of the insulating layers is disposed between two adjacent metal layers;
- at least two adjacent first wirings, wherein the first wirings are disposed in the display region, and each of the first wirings includes a first sub-wiring and a second sub-wiring extending in a same direction and separated by the functional region and the packaging region; and
- at least two adjacent windings connected between a corresponding first sub-wiring and a corresponding second sub-wiring respectively;
- wherein the plurality of insulating layers comprise a first-type insulating layer made of an organic material, the two adjacent windings are respectively disposed in different metal layers among the plurality of metal layers, and the first-type insulating layer is disposed between the two adjacent windings in a thickness direction of the display panel, and
- the display panel further comprising:
- a first metal layer disposed on the substrate;
- a first insulating layer disposed on the first metal layer;
- a second metal layer disposed on the first insulating layer;
- a second insulating layer disposed on the second metal layer;
- a third metal layer disposed on the second insulating layer;
- a third insulating layer disposed on the third metal layer and made of an organic material; and
- a fourth metal layer disposed on the third insulating layer;
- wherein one of the two adjacent windings is disposed in the first metal layer or the second metal layer, and another of the two adjacent windings is disposed in the fourth metal layer,
- wherein the plurality of metal layers comprise the first metal layer, the second metal layer, the third metal layer, and the fourth metal layer;
- wherein the plurality of insulating layers comprise the first insulating layer, the second insulating layer, and the third insulating layer.

2. The display panel according to claim 1, wherein the plurality of insulating layers further comprise a second-type insulating layer made of an inorganic material, and the first-type insulating layer and the second-type insulating layer are disposed between the two adjacent windings in the thickness direction of the display panel.

3. The display panel according to claim 1, wherein a layer structure of the display panel comprises an anode disposed above the substrate, the plurality of metal layers are disposed between the substrate and the anode, and the two adjacent windings are respectively disposed in a metal layer adjacent to the substrate and a metal layer adjacent to the anode among the plurality of metal layers in the thickness direction of the display panel.

4. The display panel according to claim 1, further comprising:
- a buffer layer on the substrate;
- a semiconductor layer on the buffer layer;
- a first gate insulating layer on the semiconductor layer;
- a first gate metal layer on the first gate insulating layer;
- a second gate insulating layer on the first gate metal layer;
- a second gate metal layer on the second gate insulating layer;
- a first interlayer insulating layer on the second gate metal layer;
- a second interlayer insulating layer on the first interlayer insulating layer;
- a source-drain metal layer on the second interlayer insulating layer;
- a first planarization layer on the source-drain metal layer;
- a first drain metal layer on the first planarization layer;
- a second planarization layer on the first drain metal layer;
- an anode layer on the second planarization layer; and
- a pixel definition layer on the anode layer;
- wherein the first gate metal layer is the first metal layer, the second gate insulating layer is the first insulating layer, the second gate metal layer is the second metal layer, the first interlayer insulating layer and the second interlayer insulating layer are the second insulating layer, the source-drain metal layer is the third metal layer, the first planarization layer is the third insulating layer, and the first drain metal layer is the fourth metal layer.

5. The display panel according to claim 1, further comprising:
- a first metal layer disposed on the substrate;
- a first insulating layer disposed on the first metal layer;
- a second metal layer disposed on the first insulating layer;
- a second insulating layer disposed on the second metal layer;
- a third metal layer disposed on the second insulating layer;
- a third insulating layer disposed on the third metal layer and made of an organic material;
- a fourth metal layer disposed on the third insulating layer;
- a fourth insulating layer is disposed on the fourth metal layer and made of an organic material; and a fifth metal layer disposed on the fourth insulating layer;

wherein one of the two adjacent windings is disposed in one of the first metal layer and the second metal layer, and an other of the two adjacent windings is disposed in one of the fourth metal layer and the fifth metal layer, wherein the plurality of metal layers comprise the first metal layer, the second metal layer, the third metal layer, the fourth metal layer, and the fifth metal layer;

wherein the plurality of insulating layers comprise the first insulating layer, the second insulating layer, the third insulating layer, and the fourth insulating layer.

6. The display panel according to claim 5, further comprising:

a buffer layer on the substrate;

a semiconductor layer on the buffer layer;

a first gate insulating layer on the semiconductor layer;

a first gate metal layer on the first gate insulating layer;

a second gate insulating layer on the first gate metal layer;

a second gate metal layer on the second gate insulating layer;

a first interlayer insulating layer on the second gate metal layer;

a second interlayer insulating layer on the first interlayer insulating layer;

a source-drain metal layer on the second interlayer insulating layer;

a first planarization layer on the source-drain metal layer;

a first drain metal layer on the first planarization layer;

a second planarization layer on the first drain metal layer;

a second drain metal layer on the second planarization layer;

a third planarization layer on the second drain metal layer;

an anode layer on the third planarization layer; and a pixel definition layer on the anode layer;

the first gate metal layer is the first metal layer, the second gate insulating layer is the first insulating layer, the second gate metal layer is the second metal layer, the first interlayer insulating layer and the second interlayer insulating layer are the second insulating layer, the source-drain metal layer is the third metal layer, the first planarization layer is the third insulating layer, the first drain metal layer is the fourth metal layer, the second planarization layer is the fourth insulating layer, and the second drain metal layer is the fifth metal layer.

7. The display panel according to claim 1, wherein the two adjacent windings are a first winding and a second winding respectively, the display panel comprises a plurality of windings, the first winding and the second winding are alternately arranged;

each of the plurality of winding comprises:

a first connection line;

a third connection line; and a second connection line between the first connection line and the third connection line;

an extension direction of the second connection line is different from an extension direction of the first connection line and an extension direction of the third connection line, two separated ends of the first connection line and the third connection line are connected to a corresponding first sub-wiring and a corresponding second sub-wiring respectively;

the second connection line surrounds the functional region, and at least two second connection lines of the two adjacent windings are adjacent.

8. The display panel according to claim 5, wherein the two adjacent windings are a first winding and a second winding respectively, the display panel comprises a plurality of windings, the first winding and the second winding are alternately arranged;

each of the plurality of winding comprises:

a first connection line;

a third connection line; and a second connection line between the first connection line and the third connection line;

an extension direction of the second connection line is different from an extension direction of the first connection line and an extension direction of the third connection line, two separated ends of the first connection line and the third connection line are connected to a corresponding first sub-wiring and a corresponding second sub-wiring respectively;

the second connection line surrounds the functional region, and at least two second connection lines of the two adjacent windings are adjacent.

9. The display panel according to claim 7, wherein a plurality of the second connection lines are alternately arranged in different metal layers according to an arrangement order of a plurality of the first connection lines.

10. The display panel according to claim 7, wherein projections of the two adjacent windings in a thickness direction of the display panel do not overlap.

11. The display panel according to claim 7, wherein the display panel further comprises a data line not having a winding in the display region, the first wiring is a data line, the winding is connected between a first sub-wiring and a second sub-wiring of a same data line, and the winding disposed in the fourth metal layer or the fifth metal layer has a same resistance as the data line not having a winding of a same length in an extension direction of the data line not having a winding.

12. The display panel according to claim 7, wherein a width of the second connection line is less than a width of the first connection line and a width of the third connection line.

13. The display panel according to claim 12, wherein the width of the second connection line is less than a width of the first sub-wiring and a width of the second sub-wiring, and the width of the first connection line and the width of the third connection line are both greater than the width of the first sub-wiring and the width of the second sub-wiring.

14. A display device, comprising a housing and a display panel, wherein the display panel is housed in the housing;

wherein the display panel has a functional region, a packaging region surrounding the functional region, and a display region surrounding the packaging region, the display panel comprises:

a substrate;

a plurality of metal layers and a plurality of insulating layers above the substrate, wherein at least one of the insulating layers is disposed between two adjacent metal layers;

at least two adjacent first wiring, wherein the first wirings are disposed in the display region, and each of the first wirings includes a first sub-wiring and a second sub-wiring extending in a same direction and separated by the functional region and the packaging region; and at least two adjacent windings connected between a corresponding first sub-wiring and a corresponding second sub-wiring respectively;

wherein the plurality of insulating layers comprise a first-type insulating layer made of an organic material, the two adjacent windings are disposed in different metal layers among the plurality of metal layers, and the first-type insulating layer is disposed between the two adjacent windings in a thickness direction of the display panel, and wherein the display panel further comprises:

a first metal layer disposed on the substrate;

a first insulating layer disposed on the first metal layer;

a second metal layer disposed on the first insulating layer;

a second insulating layer disposed on the second metal layer;

a third metal layer disposed on the second insulating layer;

a third insulating layer disposed on the third metal layer and made of an organic material; and a fourth metal layer disposed on the third insulating layer;

wherein one of the two adjacent windings is disposed in the first metal layer or the second metal layer, and an other of the two adjacent windings is disposed in the fourth metal layer, wherein the plurality of metal layers comprise the first metal layer, the second metal layer, the third metal layer, and the fourth metal layer;

wherein the plurality of insulating layer comprise the first insulating layer, the second insulating layer, and the third insulating layer.

15. The display device according to claim 14, wherein the plurality of insulating layers further comprise a second-type insulating layer made of an inorganic material, and the first-type insulating layer and the second-type insulating layer are disposed between the two adjacent windings in the thickness direction of the display panel.

16. The display device according to claim 14, wherein a layer structure of the display panel comprises an anode disposed above the substrate, the plurality of metal layers are disposed between the substrate and the anode, and the two adjacent windings are respectively disposed in a metal layer adjacent to the substrate and a metal layer adjacent to the anode among the plurality of metal layers in the thickness direction of the display panel.

17. The display device according to claim 14, wherein the display panel further comprises:

a buffer layer on the substrate;

a semiconductor layer on the buffer layer;

a first gate insulating layer on the semiconductor layer;

a first gate metal layer on the first gate insulating layer;

a second gate insulating layer on the first gate metal layer;

a second gate metal layer on the second gate insulating layer;

a first interlayer insulating layer on the second gate metal layer;

a second interlayer insulating layer on the first interlayer insulating layer;

a source-drain metal layer on the second interlayer insulating layer;

a first planarization layer on the source-drain metal layer;

a first drain metal layer on the first planarization layer;

a second planarization layer on the first drain metal layer;

an anode layer on the second planarization layer; and a pixel definition layer on the anode layer;

the first gate metal layer is the first metal layer, the second gate insulating layer is the first insulating layer, the second gate metal layer is the second metal layer, the first interlayer insulating layer and the second interlayer insulating layer are the second insulating layer, the source-drain metal layer is the third metal layer, the first planarization layer is the third insulating layer, and the first drain metal layer is the fourth metal layer.

18. The display device according to claim 14, wherein the display panel further comprises:

a first metal layer disposed on the substrate;

a first insulating layer disposed on the first metal layer;

a second metal layer disposed on the first insulating layer;

a second insulating layer disposed on the second metal layer;

a third metal layer disposed on the second insulating layer;

a third insulating layer disposed on the third metal layer and made of an organic material;

a fourth metal layer disposed on the third insulating layer;

a fourth insulating layer is disposed on the fourth metal layer and made of an organic material; and a fifth metal layer disposed on the fourth insulating layer;

wherein one of the two adjacent windings is disposed in one of the first metal layer and the second metal layer, and an other of the two adjacent windings is disposed in one of the fourth metal layer and the fifth metal layer, wherein the plurality of metal layers comprise the first metal layer, the second metal layer, the third metal layer, the fourth metal layer, and the fifth metal layer;

wherein the plurality of insulating layers comprise the first insulating layer, the second insulating layer, the third insulating layer, and the fourth insulating layer.

* * * * *